(12) United States Patent
Molho et al.

(10) Patent No.: US 7,227,394 B2
(45) Date of Patent: Jun. 5, 2007

(54) SIGNAL SYNCHRONIZER SYSTEM AND METHOD

(75) Inventors: Lee M. Molho, Los Angeles, CA (US); Michael B. Neary, Manhattan Beach, CA (US)

(73) Assignee: Xerox Corporation, Stamford, CT (US)

( * ) Notice: Subject to any disclaimer, the term of this patent is extended or adjusted under 35 U.S.C. 154(b) by 204 days.

(21) Appl. No.: 10/974,852

(22) Filed: Oct. 27, 2004

(65) Prior Publication Data

US 2006/0087351 A1    Apr. 27, 2006

(51) Int. Cl.
*H03L 7/00* (2006.01)
(52) U.S. Cl. ...................... 327/161; 327/158
(58) Field of Classification Search ............... 327/155, 327/161, 158
See application file for complete search history.

(56) References Cited

U.S. PATENT DOCUMENTS

| | | | |
|---|---|---|---|
| 4,462,681 A | 7/1984 | Aerts et al. ................... 355/14 |
| 4,777,498 A | 10/1988 | Kasamura et al. .......... 346/150 |
| 5,111,062 A | 5/1992 | Hunter et al. ............... 307/269 |
| 5,473,419 A | 12/1995 | Russel et al. ............... 355/319 |
| 5,629,762 A | 5/1997 | Mahoney et al. ........... 399/364 |
| 5,666,629 A | 9/1997 | Kazoh ......................... 399/401 |
| 5,669,056 A | 9/1997 | Rubscha ..................... 399/367 |
| 5,680,651 A | 10/1997 | Tsuji et al. .................. 399/401 |
| 5,742,881 A | 4/1998 | McTigue ..................... 399/194 |
| 5,776,287 A | 7/1998 | Best et al. ................... 156/260 |
| 5,898,275 A | 4/1999 | Taillie et al. ................ 315/115 |
| 6,075,395 A * | 6/2000 | Saeki .......................... 327/161 |
| 6,208,182 B1* | 3/2001 | Marbot et al. .............. 327/158 |
| 6,226,473 B1 | 5/2001 | Kutsuwada .................. 399/82 |
| 6,228,574 B1 | 5/2001 | Rotman ......................... 345/4 |
| 6,236,470 B1 | 5/2001 | Seachman ................... 358/471 |
| 6,281,725 B1* | 8/2001 | Hanzawa et al. ........... 327/152 |
| 6,300,807 B1* | 10/2001 | Miyazaki et al. ........... 327/158 |
| 6,396,218 B1 | 5/2002 | Proctor ..................... 315/169.3 |

* cited by examiner

*Primary Examiner*—Quan Tra
(74) *Attorney, Agent, or Firm*—Gibb & Rahman, LLC

(57) ABSTRACT

A signal synchronizer according to embodiments herein uses a delay register that receives a feedback signal. The delay register has many delay circuits, each of which are adapted to delay the feedback signal at different time intervals. A storage register made up of many binary storage devices receives a reference signal. Each storage device is adapted to store a feedback signal state of a corresponding delay circuit. As the feedback signal is delayed the additional time intervals by the successive delay circuits, it will change states (either from high to low, or low to high) and the different storage devices simultaneously store the feedback signal states of each of the delay circuits, as controlled by the reference signal. The change in feedback signal state between adjacent storage devices records a synchronization separation between the feedback signal and the reference signal. A control device synchronizes the feedback signal based on the synchronization separation as recorded by the storage register.

15 Claims, 2 Drawing Sheets

SIGNAL SYNCHRONIZER SYSTEM AND METHOD

BACKGROUND

Embodiments herein generally relate to signal phase synchronizer systems and methods. Phase lock loops (PLLs) are conventionally used to synchronize the frequency of signals. Such phase lock loops dynamically lock the frequency of a generated signal to an external repetitive reference signal. Phase lock loops use a phase detector to determine whether a feedback signal edges earlier or later than a reference signal edge. The phased detector logic generates "earlier" and "later" signals that are pulse-width modulated, widening as time separation increases. Though they are digital, those signals cannot immediately be used for control. Analog circuitry must filter and integrate such signals before the phase lock loops can dynamically lock the frequency of the signals. Thus, conventional phase lock loop circuits utilize an analog control voltage that adjusts an oscillator to yield the desired output frequency.

SUMMARY

In embodiments herein, a digital feedback signal is sent through a tapped delay line. A reference signal edge clocks a register, capturing the feedback signal at the delay line taps. The location of the feedback signal edge digitally informs the frequency control subsystem whether to raise or lower its output frequency. This closed-loop frequency control system is similar to a phase-locked loop, in that the feedback signal is generated from the output of the frequency control subsystem, yet is different than a phase locked loop because embodiments herein use the digital output from the taped delay line to directly determine whether the generated signal is synchronized with the reference signal. The delay line and register function as an all-digital phase detector, enabling the use of an all-digital frequency control subsystem.

A signal synchronizer according to embodiments herein uses a delay register that receives a feedback signal. The delay register has many delay circuits, each of which are adapted to delay the feedback signal at different time intervals. A storage register made up of many binary storage devices receives a reference signal. Each storage device is essentially dedicated to a given delay circuit and each is adapted to store a feedback signal state of the corresponding delay circuit. This "feedback signal state" is the high or low state of the feedback signal after it is delayed by each given delay circuit. As the feedback signal is delayed the additional time intervals by the successive delay circuits, it will change states (either from high to low, or low to high) and the different storage devices simultaneously store the feedback signal states of each of the delay circuits, as controlled by the reference signal.

The change in feedback signal state between adjacent storage devices records a synchronization separation between the feedback signal and the reference signal. More specifically, buffers are used to adjust the timing between the reference signal and the feedback signal such that, if the reference signal and the feedback signal are synchronized, the change in the feedback signal state will occur at a middle delay device and be recorded in a middle storage device. To the contrary, if the reference signal and the feedback signal are not synchronized, the change in feedback signal state occurs at either a delay device that delays the feedback signal less than the middle delay device delays the feedback signal, or at a delay device that delays the feedback signal more than the middle delay device delays the feedback signal.

A control device that is connected to the delay register outputs the feedback signal to the delay register. The control device synchronizes the feedback signal based on the synchronization separation as recorded by the storage register.

A method embodiment of synchronizing the feedback signal with the reference signal delays the feedback signal at different time intervals using the delay circuits and supplies the reference signal to the storage register. Under control of the reference signal, the feedback signal states are simultaneously stored in the delay circuits, such that each storage device stores the feedback signal state of a corresponding one of the delay circuits. Again, the change in feedback signal state between adjacent storage devices records a synchronization separation between the feedback signal and the reference signal. Thus, the method synchronizes the feedback signal with the reference signal based on the synchronization separation.

This method buffers the feedback signal before the process of delaying the feedback signal and buffers the reference signal before the process of supplying the reference signal to the storage register. These buffering processes adjust the timing between the reference signal and the feedback signal such that, if the reference signal and the feedback signal are synchronized, the change in the feedback signal state will occur at a middle delay device and be recorded in a middle storage device. If the reference signal and the feedback signal are not synchronized, the change in feedback signal state occurs either at a delay device that delays the feedback signal less than the middle delay device delays the feedback signal, or at a delay device that delays the feedback signal more than the middle delay device delays the feedback signal. This process supplies the feedback signal from the control device to the delay register and adjusts the timing of the feedback signal based on the synchronization separation as recorded by the storage register.

These and other features and advantages are described in, or are apparent from, the following detailed description of various exemplary embodiments of systems and methods.

BRIEF DESCRIPTION OF THE DRAWINGS

Various exemplary embodiments of the systems and methods described in detail below, with reference to the attached drawing figures, in which.

DETAILED DESCRIPTION

Figure 1:
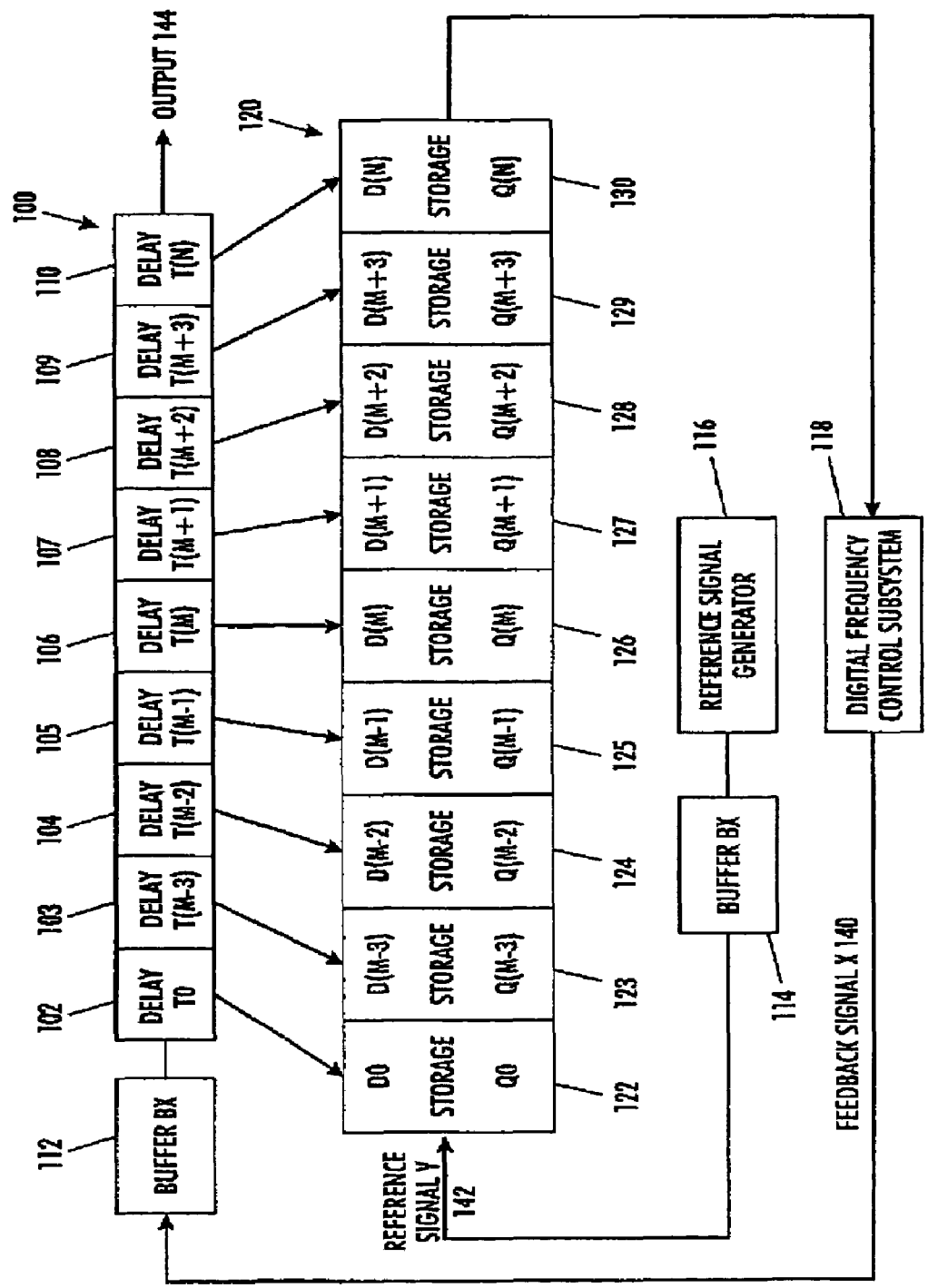
FIG. 1 is a schematic representation of a signal synchronizer according to embodiments herein.

FIG. 1 illustrates a signal synchronizer according to embodiments herein that uses a delay register 100 that receives a feedback signal X 140. The delay line (register) 100 has many delay circuits 102-110, each of which are adapted to delay the feedback signal 140 at different time intervals, which can be regularly or irregularly spaced time intervals. For example, the first delay circuit 102 could delay the feedback signal 140 one time period (e.g., one picosecond), the second delay circuit 103 could delay the feedback signal 140 two time periods (e.g., two picoseconds), the third delay circuit 104 could delay the feedback signal 140 three time periods (e.g., three picoseconds), and so on.

A storage register 120 made up of many binary storage devices 122-130 receives a reference signal Y 142. The digital feedback signal X 140 drives the input delay T0 102 of delay line 100 through buffer BX 112. The digital reference signal Y 142 drives the clock input of the storage register 120 through buffer BY 114. The delay line 100 is continuous, with output taps T0, T(M−3), T(M−2) . . . T(n) being provided for each delay circuit 102-110. Each tap is connected to the corresponding input D0, D(M−3), D(M−2) . . . D(n) of the storage devices 122-130. The outputs Q0, Q(M−3), Q(M−2) . . . Q(n) of the storage devices 122-130 are connected to a digital frequency control subsystem 118 which generates an output signal. An example of such a subsystem 118 could include a microprocessor connected to a direct digital synthesizer chip. The digital feedback signal X 140 is an application-dependent function of the output signal of the digital frequency control subsystem.

Each storage device 122-130 is adapted to store a digital logic feedback signal state of a corresponding delay circuit 102-110. Let the digital logic states be defined as "low" and "high" (although, as would be understood by those ordinarily skilled in the art, other logic states such as negative and positive, zero and a value, etc., could be used with the embodiments herein). A rising edge is defined as a transition from low to high, and "clocking a register" is defined as a transition on the clock input which causes a register to store the data on its inputs. The "feedback signal state" is the high or low state of the feedback signal 140 after it is delayed by each given delay circuit 102-110. As the feedback signal 140 is delayed the additional time intervals by the successive delay circuits 102-110, it will change states (either from high to low, or low to high). The different storage devices 122-130 simultaneously store the feedback signal states of each of the delay circuits 102-110 as they are clocked, as controlled by the reference signal 142.

The length of the longest delay (e.g., delay circuit 110) is shorter than or equal to the wavelength of the feedback signal 140. Therefore, there will be only one phase shift (only one change in the feedback signal state) among the delay circuits 102-110. Thus, the storage devices before the storage device where the phase change occurred will all record one state (e.g., high or low) of the feedback signal, while all storage devices following the storage device that records the change in feedback signal state will have the other feedback signal state. In other words, the storage device that records the change in feedback signal state is the last storage device, in the series of storage devices, which has the same feedback signal state when compared to all previous storage devices. All subsequent storage devices will have a different feedback signal state.

The delay device in which the change in feedback signal state occurs records a synchronization separation between the feedback signal 140 and the reference signal 142. If the reference signal 142 and the feedback signal 140 are synchronized, the change in the feedback signal state will occur at the middle delay device T(M) 106 and be recorded in the middle storage device 126. To the contrary, if the reference signal 142 and the feedback signal 140 are not synchronized, the change in feedback signal state occurs at either a delay device that delays the feedback signal 140 less than the middle delay device 106 delays the feedback signal 140 (e.g., delay devices 102-105), or at a delay device that delays the feedback signal 140 more than the middle delay device 106 delays the feedback signal 140 (e.g., delay devices 107-110). Thus, if the change in feedback signal state is recorded in storage devices 122-125 or 127-130, the signals are not synchronized, and the feedback signal 140 needs to be adjusted. The buffers 112, 114 can be used to adjust the timing between the reference signal 142 and the feedback signal 140 so that synchronized signals will produce the change in feedback signal state at the middle delay device 106.

The control device 118 that is connected to the delay register 100 outputs the feedback signal 140 to the delay register 100. The control device 118 synchronizes the feedback signal 140 based on the synchronization separation as recorded by the storage register 120. Thus, if the change in feedback signal state is recorded in storage devices 122-125 or 127-130, the signals are not synchronized, and the control device 118 adjusts the feedback signal 140 up or down to compensate for the difference is synchronization of with the reference signal 142. The further away from the middle storage device 126 that the change in feedback signal state occurs requires the control device 118 to make a larger change in the feedback signal 140. Therefore, a larger change would be made to the feedback signal 140 if the change in feedback signal state occurred in storage device 123 when compared to the change in feedback signal state occurring in storage device 125. Similarly, different polarity changes will be made to the feedback signal 140 by the control device 118 depending on whether the change in feedback signal state occurs on one side of the middle storage device (e.g., 122-125) or on the other side of the middle storage device (e.g., 127-130).

In normal steady-state locked operation, signals 140, 142 have edges that are nearly coincident in time. Assume that signal X 140 is active HIGH and arrives first. Its rising edge propagates through the delay line T 100 to middle tap TM, at which time signal Y 142 arrives and clocks register 120 (e.g., simultaneously clocks all the storages devices 122-130 causing all the storage devices 122-130 to simultaneously record the feedback signal state within each of the delay circuits 102-110, thereby taking a "snapshot" at a single instant of the logic state of all the delay circuits 102-110). Register outputs Q0 through Q(N) now contain a frozen image of the rising edge of signal X 140 at different delay times as delayed by the different delay circuits 102-110. In one example, at and near Q(N), the register outputs are LOW; at and near Q0, the register outputs are high. Thus, if the signals 140, 142 are synchronized, Q(M) would be high and Q(M+1) would be low.

Thus, this embodiment has measured the time separation $t_{xy}$ between signals X and Y. That time is $t_{XY} = t_{BX} + t_M - t_{BY} - t_R$, where $t_{BX}$ and $t_{BY}$ are the delays through buffers BX 112 and BY 114 respectively, $t_M$ is the delay from input T0 to tap T(M), and $t_R$ is the clock setup time of storage register 120. If the change in feedback signal state occurs at T(M) (normal steady-state locked operation) the frequency control subsystem 118 reads storage register 120 and leaves the frequency of the feedback signal 140 alone.

Now consider the case where signal X 140 is just slightly too fast. The rising edge of signal X 140 arrives a little earlier, reaching delay line tap T(M+1) before storage register 120 is clocked. The frequency control subsystem 118 observes that Q(M+1) and all preceding storage devices 122-126 are high instead of low and that Q(M+2) and all following storage devices 128-130 are low. The frequency control subsystem 118 infers that its generated frequency 140 is too high and lowers it. Correspondingly, if the frequency control subsystem 118 were to observe that Q(M−1) and all preceding storage devices were high and Q(M) and all following storage devices were low, it would infer that it needed to raise its generated frequency 140.

The above operation corresponds to the locked behavior and the following describes how the embodiments herein behave prior to lock. Assume that the feedback signal 140 is very slow indeed. When storage register 120 is clocked, all its outputs will be low because no edge has occurred. The frequency control subsystem 118 is free to increase its generated frequency 140 as much as it wants. Suppose it overshoots greatly, so that the next rising edge occurs much too soon. This time all the outputs of storage register 120 are high. The frequency control subsystem 118 lowers its generated frequency, but only by half of its first step. At the next reference signal clock Y 142, storage register 120 outputs become all low again because the generated frequency is too low again. The frequency control system infers that it must raise its generated frequency because it undershot the target. It does so, but again only by half as much as its last step. This successive approximation algorithm continues, allowing the control subsystem 118 to converge on the proper frequency. The only requirement for this locking behavior is that the maximum delay of the delay line 100, $t_N$, should be greater than the peak-to-peak jitter of the digital reference signal Y 142.

Figure 2:
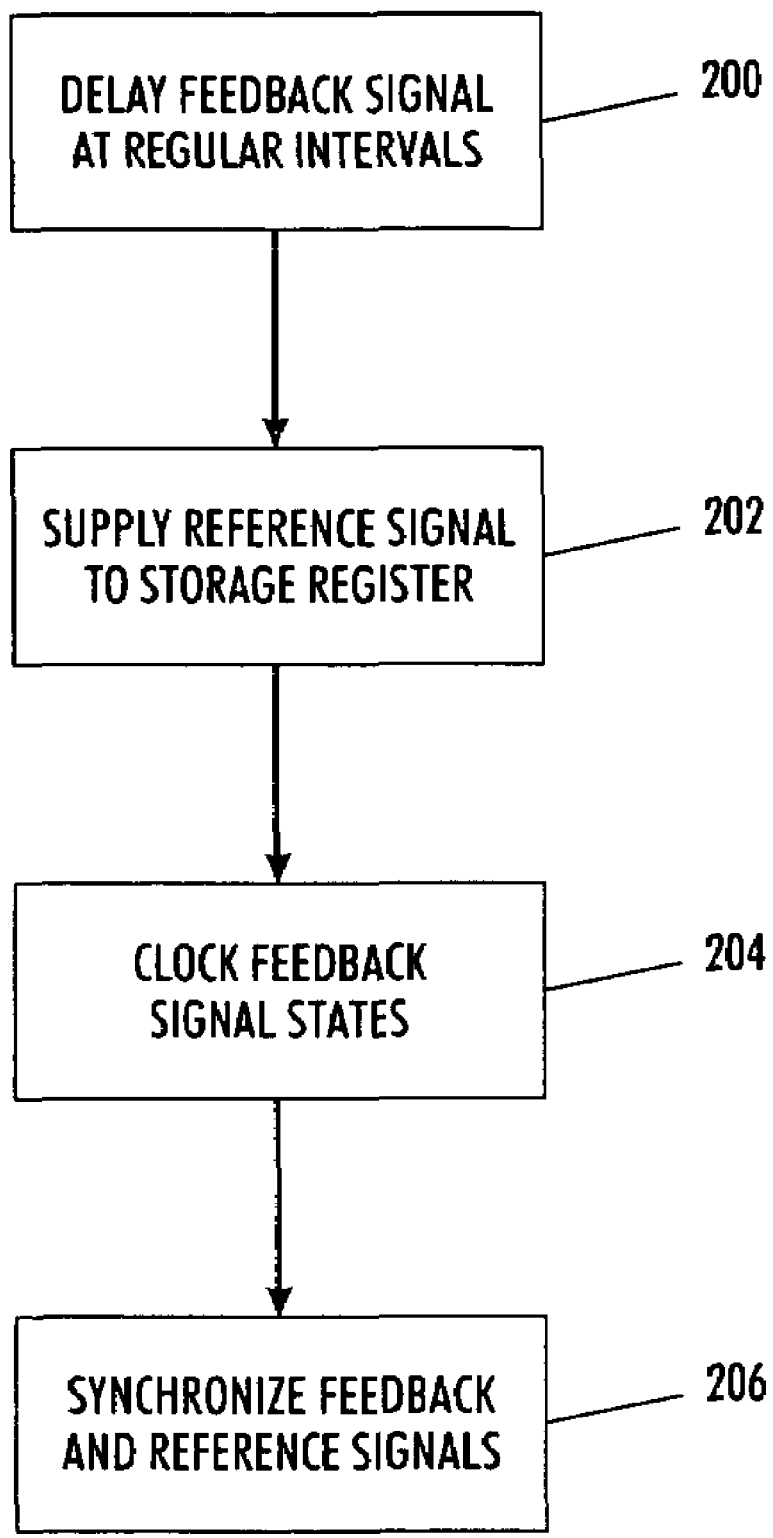
FIG. 2 is a flow diagram illustrating the flow of embodiments herein.

FIG. 2 is a flowchart illustrating the flow of embodiments herein. More specifically, in item 200, the delay register 100 delays the feedback signal 140 at different time intervals using the delay circuits 102-110. In item 202, the reference signal 142 is supplied to the storage register 120. Under control of the reference signal 142, the feedback signal states in the delay circuits 102-110 are clocked (simultaneously stored) in the storage circuits 122-130, in item 204. Again, the change in feedback signal 140 state between adjacent storage devices 122-130 records a synchronization separation between the feedback signal 140 and the reference signal 142. Then, the method synchronizes the feedback signal 140 with the reference signal 142 based on the synchronization separation in item 206. This process supplies the feedback signal 140 from the control device 118 to the delay register 100 and adjusts the timing of the feedback signal 140 based on the synchronization separation as recorded by the storage register 120.

Embodiments herein can be used, for example, to perform the critical function of accurately locking the video bitstream to the actual position of the scanning laser beam in the fast-scan direction. The embodiments herein, when combined with an appropriate digital frequency control subsystem and feedback generation logic 118, enable a major increase in beam position precision. Successive approximation and other fast locking algorithms enabled by the embodiments herein are far faster than standard PLL circuits. Standard PLL phase detectors produce a signal which becomes vanishingly small as feedback and reference edges coincide. Analog effects limit precision because meaningful feedback disappears as perfection is attained. That behavior also causes output frequency jitter as the PLL system hunts continuously for the correct frequency. The embodiments herein are digital and have no such limitations. Standard PLL phase detectors produce a signal which requires analog processing before it can be used for control. That analog processing causes control response lag and sensitivity to noise, component variations, voltage, and temperature. The embodiments herein are far more robust because of their all-digital nature.

The embodiments herein allow a far larger class of feedback signal processing than do standard PLL phase detectors. While the latter are constrained to use linear analog filtering and integration for stable operation, the embodiments herein are digital and have no such requirements. Standard PLL phase detectors require tradeoffs in achieving good frequency locking behavior versus stability while locked. The embodiments herein are digital and allow optimization of both without any such tradeoffs.

While the foregoing has been described in conjunction with various exemplary embodiments, it is to be understood that many alternatives, modifications and variations would be apparent to those skilled in the art. Accordingly, Applicants intend to embrace all such alternatives, modifications and variations that follow in this spirit and scope.

What is claimed is:

1. A signal synchronizer comprising:
a delay register adapted to receive a feedback signal, wherein said delay register comprises delay circuits; and
a storage register adapted to receive a reference signal, wherein said storage resister comprises a series of storage devices, and wherein each storage device is adapted to store a feedback signal state of a corresponding one of said delay circuits, wherein said delay circuits are adapted to delay said feedback signal at different time intervals, and wherein said storage devices are adapted to simultaneously store feedback signal states of said delay circuits;
buffers respectively connected to said delay register and said storage register; and
a control subsystem connected to said storage register and said delay register,
wherein said control subsystem is adapted to output said feedback signal to said delay register and, to adjust a phase of said feedback signal supplied to said delay register based on a position of a phase transition storage device within said storage register,
wherein, within said storage register, all storage devices on one side of said phase transition storage device have a first signal state and all storage devices on the other side of said phase transition storage device have a second signal state, different than said first signal state, and
wherein said buffers delay said feedback signal and said reference signal in such a manner that if said reference signal and said feedback signal are synchronized, a change in feedback signal state will occur at a middle delay device and be recorded in a middle storage device.

2. The signal synchronizer according to claim 1, wherein if said reference signal and said feedback signal are not synchronized, said change in feedback signal state occurs one of:
at a delay device adapted to delay said feedback signal less than said middle delay device delays said feedback signal; and
at a delay device adapted to delay said feedback signal more than said middle delay device delays said feedback signal.

3. The signal synchronizer according to claim 1, wherein said control subsystem synchronizes said feedback signal based on synchronization separation as recorded by said storage register.

4. The signal synchronizer according to claim 1, wherein said storage devices comprise binary circuits.

5. A signal synchronizer comprising:
a delay register adapted to receive a feedback signal, wherein said delay register comprises delay circuits;
a storage register adapted to receive a reference signal, wherein said storage resister comprises series of storage devices, wherein each storage device is adapted to store a feedback signal state of a corresponding one of said delay circuits, wherein said delay circuits are adapted to delay said feedback signal at different time intervals, wherein said storage devices are adapted to simultaneously store feedback signal states of said delay circuits, as controlled by said reference signal, such that a change in feedback signal state between adjacent storage devices records a synchronization separation between said feedback signal and said reference signal, wherein application of said delay to said feedback signal at said different time intervals causes said series of storage devices to record a signal state of said feedback signal at successively different points in time;

buffers respectively connected to said delay register and said storage register; and a control subsystem connected to said storage registers and said delay registers, wherein said control subsystem is adapted to output said feedback signal to said delay register and, to adjust a phase of said feedback signal supplied to said delay register based on a position of a phase transition storage device that records a change in feedback signal state within said storage register, wherein, within said storage register, all storage devices on one side of said phase transition storage device have a first signal state and all storage devices on the other side of said phase transition storage device have a second signal state, different than said first signal state, and wherein said buffers delay said feedback signal and said reference signal in such a manner that if said reference signal and said feedback signal are synchronized, a change in feedback signal state will occur at a middle delay device and be recorded in a middle storage device.

6. The signal synchronizer according to claim 5, wherein if said reference signal and said feedback signal are not synchronized, said change in feedback signal state occurs one of:

at a delay device adapted to delay said feedback signal less than said middle delay device delays said feedback signal; and at a delay device adapted to delay said feedback signal more than said middle delay device delays said feedback signal.

7. The signal synchronizer according to claim 5, wherein said control subsystem synchronizes said feedback signal based on synchronization separation as recorded by said storage register.

8. The signal synchronizer according to claim 5, wherein said storage devices comprise binary circuits.

9. A method of synchronizing a feedback signal with a reference signal, said method comprising:

buffering said feedback signal;

after said buffering of said feedback signal, delaying said feedback signal at different time intervals using a plurality of delay circuits;

buffering said reference signal;

after said buffering of said reference signal, supplying said reference signal to a storage register, wherein said storage resister comprises a series of storage devices; and simultaneously storing feedback signal states of said delay circuits in said storage devices, as controlled by said reference signal, such that each storage device stores a feedback signal state of a corresponding one of said delay circuits;

supplying said feedback signal from a control device to said delay register; and adjusting a phase of said feedback signal supplied to said delay register based on a position of a phase transition storage device within said storage register, wherein, within said series of storage devices, all storage devices on one side of said phase transition storage device have a first signal state and all storage devices on the other side of said phase transition storage device have a second signal state, different than said first signal state, wherein a change in feedback signal state between adjacent storage devices records a synchronization separation between said feedback signal and said reference signal, and wherein said buffering of said feedback signal and said buffering of said reference signal delay said feedback signal and said reference signal in such a manner that if said reference signal and said feedback signal are synchronized, a change in feedback signal state will occur at a middle delay device and be recorded in a middle storage device.

10. The method according to claim 9, wherein if said reference signal and said feedback signal are not synchronized, said change in feedback signal state occurs one of:

at a delay device adapted to delay said feedback signal less than said middle delay device delays said feedback signal; and at a delay device adapted to delay said feedback signal more than said middle delay device delays said feedback signal.

11. The method according to claim 9, wherein said adjusting of said phase of said feedback signal is based on said synchronization separation as recorded by said storage register.

12. The method according to claim 9, wherein said storage devices comprise binary circuits.

13. A method of synchronizing a feedback signal with a reference signal, said method comprising:

buffering said feedback signal;

after said buffering of said feedback signal, delaying said feedback signal at different time intervals using a plurality of delay circuits;

buffering said reference signal;

after said buffering of said reference signal, supplying said reference signal to a storage register, wherein said storage resister comprises a series of storage devices;

simultaneously storing feedback signal states of said delay circuits in said storage devices, as controlled by said reference signal, such that each storage device stores a feedback signal state of a corresponding one of said delay circuits, wherein said delaying of said feedback signal at said different time intervals causes said series of storage devices to record a signal state of said feedback signal at successively different points in time;

supplying said feedback signal from a control device to said delay register; and adjusting a phase of said feedback signal supplied to said delay register based on a position of a phase transition storage device within said storage register, wherein, within said series of storage devices, all storage devices on one side of said phase transition storage device have a first signal state and all storage devices on the other side of said phase transition storage device have a second signal state, different than said first signal state, wherein a change in feedback signal state between adjacent storage devices records a synchronization separation between said feedback signal and said reference signal and said adjusting synchronizes said feedback signal with a reference signal, based on said synchronization separation, and wherein said buffering of said feedback signal and said buffering of said reference signal delay said feedback signal and said reference signal in such a manner that if said reference signal and said feedback signal are synchronized, a change in feedback signal state will occur at a middle delay device and be recorded in a middle storage device.

14. The method according to claim 13, wherein if said reference signal and said feedback signal are not synchronized, said change in feedback signal state occurs one of:

at a delay device adapted to delay said feedback signal less than said middle delay device delays said feedback signal; and at a delay device adapted to delay said feedback signal more than said middle delay device delays said feedback signal.

15. The method according to claim 13, wherein said storage devices comprise binary circuits.

* * * * *